(12) United States Patent
Hung et al.

(10) Patent No.: US 10,153,355 B2
(45) Date of Patent: Dec. 11, 2018

(54) SEMICONDUCTOR MIXED GATE STRUCTURE

(71) Applicant: TAIWAN SEMICONDUCTOR MANUFACTURING COMPANY LTD., Hsinchu (TW)

(72) Inventors: Sheng Chiang Hung, Hsinchu (TW); Tsung-Che Lu, Tainan (TW); Chih-Fu Chang, Pingtung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/959,666

(22) Filed: Dec. 4, 2015

(65) Prior Publication Data
US 2017/0162667 A1   Jun. 8, 2017

(51) Int. Cl.
| | | |
|---|---|---|
| *H01L 29/66* | (2006.01) | |
| *H01L 21/28* | (2006.01) | |
| *H01L 29/51* | (2006.01) | |
| *H01L 29/78* | (2006.01) | |
| *H01L 27/06* | (2006.01) | |

(52) U.S. Cl.
CPC .. *H01L 29/66545* (2013.01); *H01L 21/28114* (2013.01); *H01L 27/0629* (2013.01); *H01L 29/51* (2013.01); *H01L 29/66795* (2013.01); *H01L 29/785* (2013.01)

(58) Field of Classification Search
CPC ............. H01L 29/785; H01L 29/66795; H01L 29/66545; H01L 29/6681
See application file for complete search history.

(56) References Cited

U.S. PATENT DOCUMENTS

| | | | |
|---|---|---|---|
| 9,006,094 B2* | 4/2015 | Jagannathan | H01L 21/28211 257/410 |
| 2004/0099903 A1* | 5/2004 | Yeo | H01L 29/66795 257/317 |
| 2006/0068550 A1* | 3/2006 | Chang | H01L 21/845 438/275 |
| 2007/0235763 A1* | 10/2007 | Doyle | H01L 29/785 257/202 |
| 2012/0161251 A1* | 6/2012 | Haverty | H01L 29/513 257/411 |
| 2014/0282326 A1* | 9/2014 | Chen | G06F 17/5081 716/111 |
| 2015/0279995 A1* | 10/2015 | Maeda | H01L 29/7848 257/192 |
| 2016/0276429 A1* | 9/2016 | Tseng | H01L 29/0649 |

* cited by examiner

*Primary Examiner* — Tucker J Wright
(74) *Attorney, Agent, or Firm* — WPAT, P.C., Intellectual Property Attorneys; Anthony King

(57) ABSTRACT

A semiconductor structure and a method for forming the same are provided. The semiconductor structure comprises a substrate, a fin structure, a metal gate and a first polysilicon strip. The fin structure is on the substrate. The metal gate is over the fin structure and is substantially perpendicular to the fin structure. The first polysilicon strip is at a first edge of the fin structure and is substantially parallel to the metal gate.

20 Claims, 6 Drawing Sheets

SEMICONDUCTOR MIXED GATE STRUCTURE

FIELD

The present disclosure relates generally to a semiconductor structure and more particularly relates to a three dimensional transistor.

BACKGROUND

For integrated circuit manufacturers, one of the several strategies employed for improving integration level and reducing manufacturing cost of integration circuits is the introduction of multi-gate devices (e.g., a multiple gate field-effect transistor, which incorporates more than one gate into a single transistor). The multi-gate device, such as a fin field effect transistor (FinFET), is proposed to replace the conventional planar MOSFET since it is getting harder and harder to reduce the physical dimension of the conventional planar MOSFET.

By forming a three dimensional fin of semiconductor material, and fabricating metal or polysilicon gate structures over the fins, the gate width of the transistor can be longer for a given area, increasing device performance even as the semiconductor processes continue to shrink, and improving density. Standard cell libraries are now implemented using FinFET transistors. However, the use of FinFET transistors in the standard cell methodologies creates additional problems in verification

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
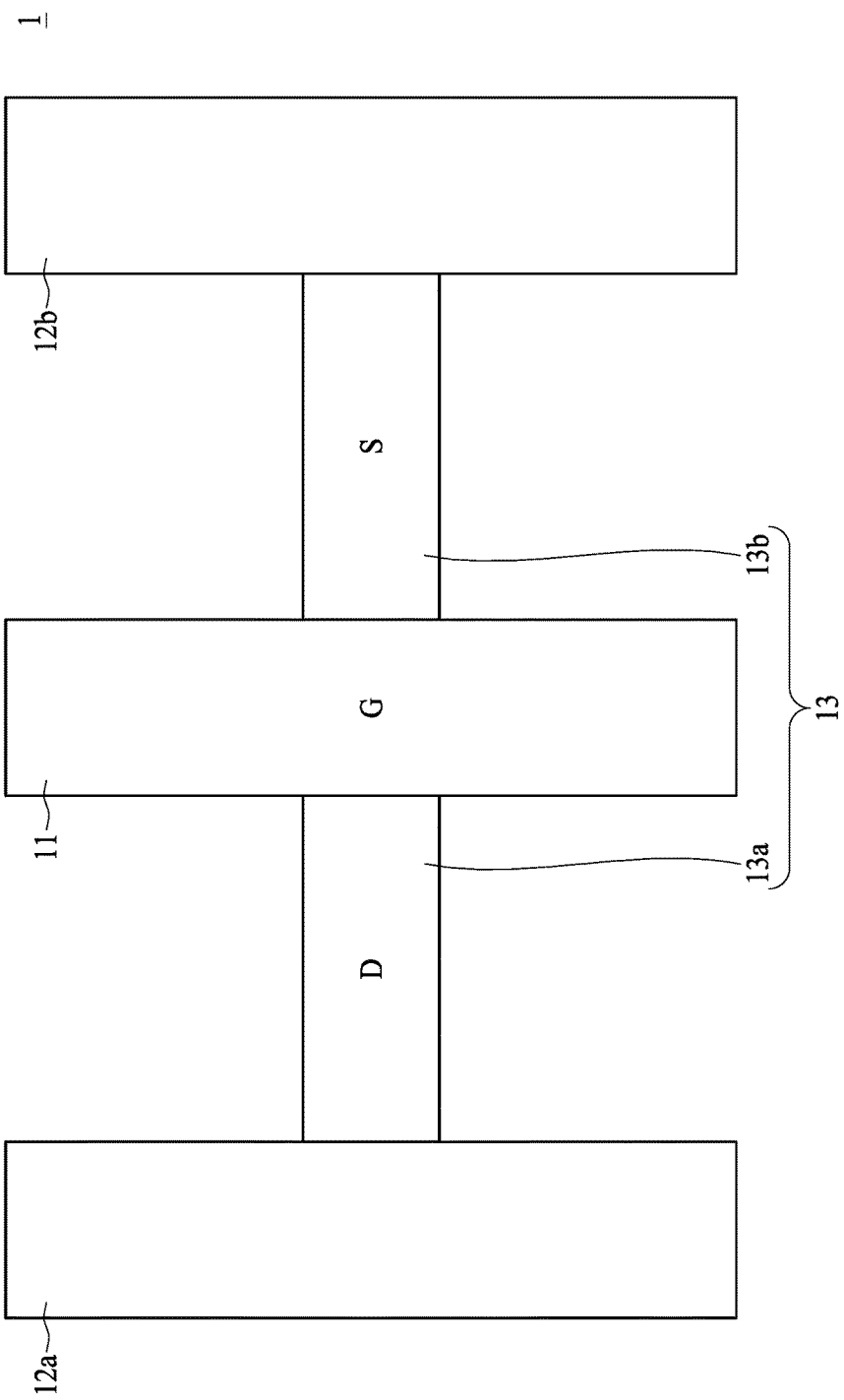
FIG. 1A is a top view illustrating a semiconductor structure in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1A illustrates a top view of a semiconductor structure 1 in accordance with one embodiment of the present disclosure. The semiconductor structure 1 may be a multi-gate non-planar field effect transistor (e.g., FinFET). The semiconductor structure 1 comprises a gate structure 11, polysilicon gate structures 12a, 12b and a fin structure 13.

The fin structure 13 is formed on the substrate (not shown in the drawing). The substrate is an underlying layer that provides support to the semiconductor structure 1. The substrate may be a bulk silicon substrate, epitaxial silicon substrate, silicon germanium substrate, silicon carbide substrate, silicon germanium substrate, or other group III-V compound substrate. The fin structure 13 may have a source region 13b, a drain regions 13a and a channel region. In some embodiments, the fin structure 13 may be uniformly doped. The fin structure extends across an active area or "OD" area for the semiconductor structure 1.

The fin structure 13 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure 13 into the substrate. Areas not protected by the masking element are etched using reactive ion etching (RIE) processes and/or other suitable processes. In some embodiments, the fin structure 13 is formed by patterning and etching a portion of the substrate. Alternatively, the fin structure 13 is formed by patterning and etching a silicon layer deposited overlying an insulator layer (for example, an upper silicon layer of a silicon-insulator-silicon stack of an SOI substrate). As an alternative to traditional photolithography, the fin structure 13 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 13 may be formed in a similar manner.

The use of standard cells (such as the semiconductor structure 1) to design integrated circuit provides a method to reduce the design cycle time needed to implement a new function in silicon by using a library of known functional primitive blocks, including for example but without limitation NAND-NAND, NAND-NOR, XOR, AND-OR logical blocks, and other functional blocks such as adders, multiplexers, de-multiplexers, flip-flops, register files, input and output buffers, and the like. Register files, stacks and other data storage blocks can also be part of the library of standard cells. By using a library of blocks that already have a verified layout defined at the transistor level, the need to perform the layout design for each new functional definition for an integrated circuit to be manufactured is eliminated.

Further, by defining the standard cell library using physical cell structures having a predetermined uniform layout pitch, dense packing of the cells can be obtained, so that a very dense placement of the transistors is achieved. Automatic placement and routing tools may be used with the standard cell library and the corresponding predefined layouts of the standard cells to further shorten the time needed to manufacture an integrated circuit that implements a user defined function. The semiconductor structure 1 is one illustrative example of a standard cell formed using FinFET transistors.

The gate structure 11 is formed in parallel and intersecting the fin structure 13. The gate structure 11 can be formed of any suitable gate electrode material. In one exemplary embodiment, the gate structure 11 could be a metal gate electrode formed by, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 11 needs not be a single material, but could include a composite stack of thin films.

The polysilicon gate structure 12a is formed at one edge of the fin structure 13, and the polysilicon gate structure 12b is formed at an opposite edge of the fin structure 13. The polysilicon gate structures 12a, 12b may be polysilicon, such as a doped polysilicon material. These polysilicon on OD edge ("PODE") structures are used to protect the edges of the fin structure 13 during processing. That is, the polysilicon gate structures 12a, 12b are not electrically connected as gates for MOS devices but are instead "dummy" structures. The polysilicon gate structures 12a, 12b cover and protect the edges of the fin structure 13, providing additional reliability during processing. In some embodiments, the polysilicon gate structure 12a, 12b can be connected with other circuits as a high impedance element.

Figure 1B:
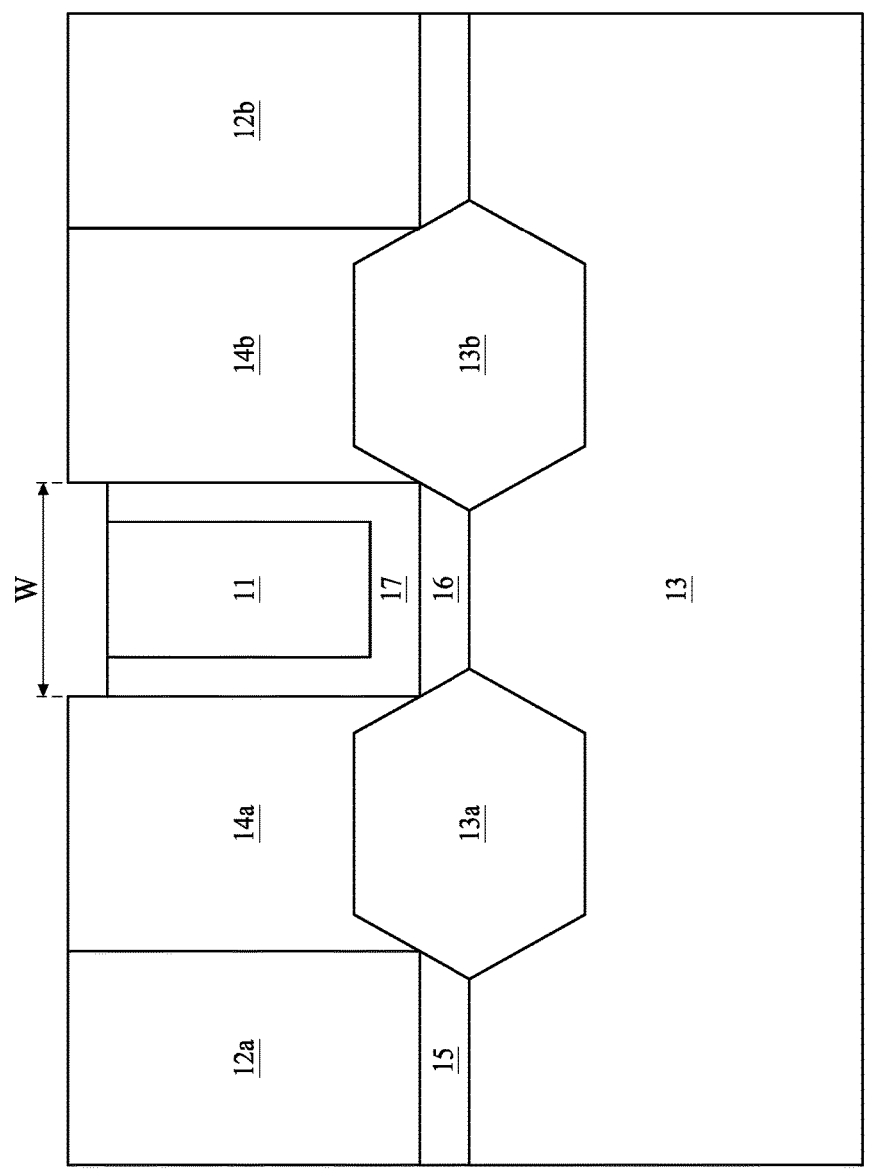
FIG. 1B is a cross-sectional view illustrating a semiconductor structure in accordance with FIG. 1A of the present disclosure.

FIG. 1B is a cross-sectional view of the semiconductor structure 1 in FIG. 1A, in accordance with one embodiment of the present disclosure. The semiconductor structure 1 comprises a gate structure 11, polysilicon gate structures 12a, 12b, a fin structure 13, inter-layer dielectric (ILD) layers 14a, 14b and a first dielectric layer 15, a second dielectric layer 16 and a high-k dielectric (HK) layer 17.

The fin structure 13 is formed on the substrate (not shown in the drawing). The substrate is an underlying layer that provides support to the semiconductor structure 1. The substrate may be a bulk silicon substrate, epitaxial silicon substrate, silicon germanium substrate, silicon carbide substrate, silicon germanium substrate, or other group III-V compound substrate. The fin structure 13 may have a source region 13b, a drain regions 13a and a channel region. In some embodiments, the fin structure 13 may be uniformly doped. The fin structure extends across an active area or "OD" area for the semiconductor structure 1.

The fin structure 13 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure 13 into the substrate. Areas not protected by the masking element are etched using reactive ion etching (RIE) processes and/or other suitable processes. In some embodiments, the fin structure 13 is formed by patterning and etching a portion of the substrate. Alternatively, the fin structure 13 is formed by patterning and etching a silicon layer deposited overlying an insulator layer (for example, an upper silicon layer of a silicon-insulator-silicon stack of an SOI substrate). As an alternative to traditional photolithography, the fin structure 13 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 13 may be formed in a similar manner.

The gate structure 11 is formed in parallel and intersecting the fin structure 13. The gate structure 11 can be formed of any suitable gate electrode material. In one exemplary embodiment, the gate structure 11 could be a metal gate electrode formed by, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 11 needs not be a single material, but could include a composite stack of thin films. The width W of the gate structure 11 defines a channel length of the semiconductor structure 1. In some embodiments, the gate structure 11 may be formed by a deposition process, including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

The polysilicon gate structure 12a is formed at one edge of the fin structure 13, and the polysilicon gate structure 12b is formed at an opposite edge of the fin structure 13. The polysilicon gate structures 12a, 12b may be polysilicon, such as a doped polysilicon material. These polysilicon on OD edge structures are used to protect the edges of the fin structure 13 during processing. That is, the polysilicon gate structures 12a, 12b are not electrically connected as gates for MOS devices but are instead "dummy" structures. The polysilicon gate structures 12a, 12b cover and protect the edges of the fin structure 13, providing additional reliability during processing. In some embodiments, the polysilicon gate structure 12a, 12b can be connected with other circuits as a high impedance element. In some embodiments, the polysilicon gate structure 12a, 12b may be formed by a deposition process, including chemical vapor deposition, physical vapor deposition, atomic layer deposition, high density plasma CVD, remote plasma CVD, plasma enhanced CVD, low-pressure CVD, atomic layer CVD, atmospheric pressure CVD, other suitable methods, or combinations thereof.

The first dielectric layer 15 is disposed between the fin structure 13 and the polysilicon gate structures 12a, 12b. The first dielectric layer 15 can be formed by any gate dielectric material. In one embodiment, the first dielectric layer 15 includes a silicon dioxide, silicon oxynitride or a silicon nitride dielectric layer. The thickness of the first dielectric layer 15 may be between about 5 Å to about 30 Å.

The second dielectric layer 16 is disposed between the fin structure 13 and the gate structure 11. The second dielectric layer 16 can be formed by any gate dielectric material. In one embodiment, the second dielectric layer 16 includes a silicon dioxide, silicon oxynitride or a silicon nitride dielectric layer. The thickness of the second dielectric layer 16 may be between about 5 Å to about 30 Å. In some embodiments, the material of the second dielectric layer 16 is different from that of the first dielectric layer 15. Alternatively, the first dielectric layer 15 and the second dielectric layer 16 can be formed by same materials.

The HK layer 17 surrounds the gate structure 11. The HK layer may have a k value greater than about 7.0, and may include an oxide or a silicate of Hf, Al, Zr, La, Mg, Ba, Ti, Pb, and combinations thereof. Exemplary materials of the HK layer 17 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The HK layer 17 may be formed by a suitable process such as atomic layer deposition (ALD), chemical vapor deposition, Molecular-Beam Deposition (MBD), physical vapor deposition, thermal oxidation, UV-ozone oxidation, or combinations thereof.

The ILD layer 14a is between the gate structure 11 and the polysilicon gate structure 12a and the ILD layer 14b is between the gate structure 11 and the polysilicon gate structure 12b. The ILD layers 14a, 14b are used for electrical separation and features low dielectric constant k to minimize capacitive coupling. The ILD layers 14a, 14b may be formed by chemical vapor deposition, high density plasma CVD, spin-on deposition, physical vapor deposition (PVD or sputtering), or other suitable methods. The ILD layers 14a, 14b may include silicon oxide, silicon oxynitride, a low-k material, and/or other suitable dielectric. In some embodiments, the ILD layers 14a, 14b may be formed on and surrounding the gate structure 11 and the fin structure 13.

In some existing approaches, the metal gate structures would be at both edges of the fin structure as dummy gates. However, since the dummy metal gates are made of conductive materials, they cannot be used as high impedance elements. In addition, the dummy metal gates and the gate structure may have undesired decoupling effect, which would degrade the performance of the semiconductor device. In accordance with some embodiments of the present disclosure, the polysilicon gate structures 12a, 12b are located at both edges of the fin structure 13 as dummy gate structures. Since the polysilicon gate structures 12a, 12b are made of polysilicon, they can be used as high impedance elements. Therefore, the application for designing the circuit by using the semiconductor structure 1 in FIG. 1 would be more flexible. In addition, since the gate structure 11 is made of metal while the polysilicon gate structures 12a, 12b are made of polysilicon, the decoupling effect between the polysilicon gate structures 12a, 12b and the gate structure 11 or the decoupling effect between the polysilicon gate structures 12a, 12b of the semiconductor structure 1 and the polysilicon gate structures of the adjacent semiconductor structure would be eliminated. Furthermore, the time dependence dielectric breakdown (TDDB) of the polysilicon gate structure is better than that of the metal gate structure.

FIGS. 2A-2D schematically illustrate a method of forming a semiconductor structure (e.g., FinFET) in accordance with one embodiment of the present disclosure.

Figure 2A:
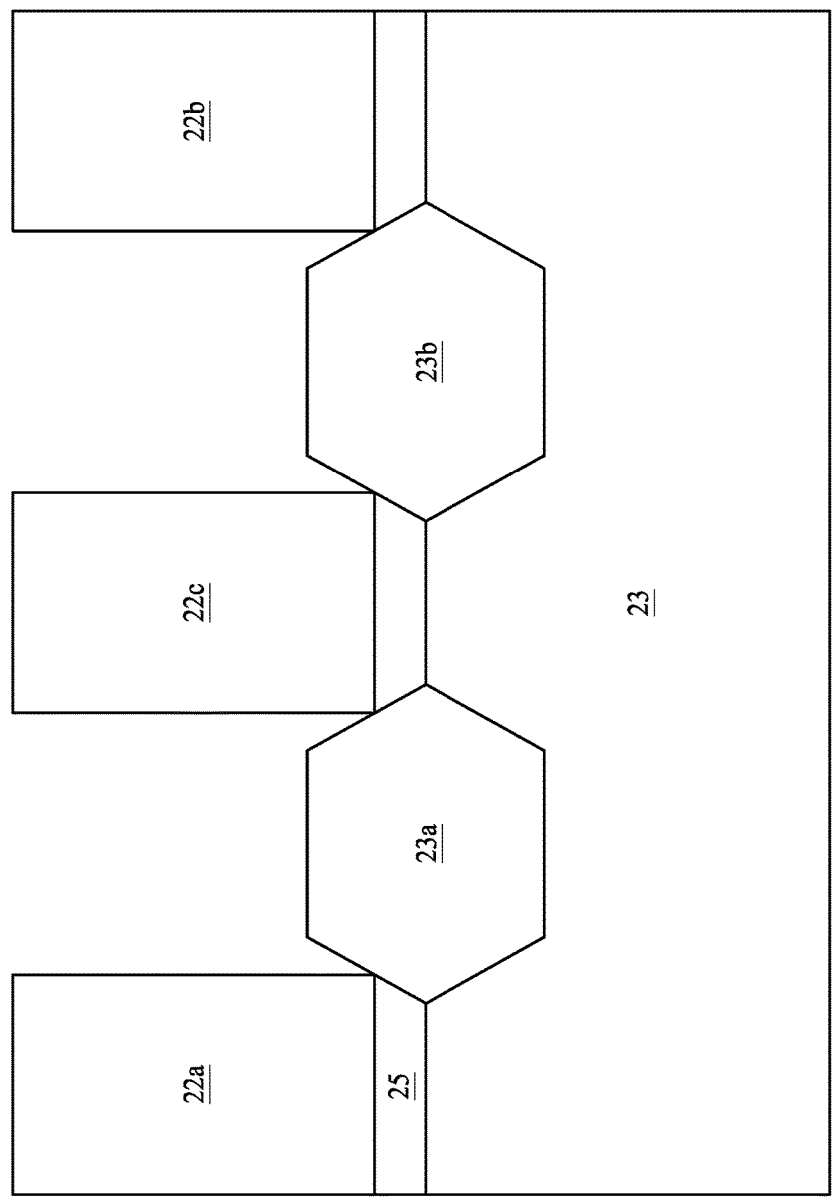
FIGS. 2A-2D schematically illustrate a method of forming a semiconductor structure in accordance with one embodiment of the present disclosure.

Referring to FIG. 2A, a fin structure 23 is formed on a surface of the substrate (not shown in the drawing). The substrate may be an SOI substrate at least including a BOX layer and a base substrate layer (not shown). The material of the BOX layer may be $SiO_2$ and the base substrate layer may be formed from silicon, germanium or III-V compounds. In other embodiments, the substrate can be a silicon substrate. In some embodiments, the fin structure 23 may be uniformly doped.

The fin structure 23 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure 23 into the substrate. Areas not protected by the masking element are etched using reactive ion etching (RIE) processes and/or other suitable processes. In some embodiments, the fin structure 23 is formed by patterning and etching a portion of the substrate. Alternatively, the fin structure 23 is formed by patterning and etching a silicon layer deposited overlying an insulator layer (for example, an upper silicon layer of a silicon-insulator-silicon stack of an SOI substrate). As an alternative to traditional photolithography, the fin structure 23 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 23 may be formed in a similar manner.

The dielectric layer 25 is formed on the fin structure 23. The dielectric layer 25 can be formed by any gate dielectric material. In one embodiment, the dielectric layer 25 includes a silicon dioxide, silicon oxynitride or a silicon nitride dielectric layer. The thickness of dielectric layer 25 may be between about 5 Å to about 30 Å. The dielectric layer 25 may be formed by a suitable process such as atomic layer deposition (ALD), chemical vapor deposition, Molecular-Beam Deposition (MBD), physical vapor deposition, thermal oxidation, UV-ozone oxidation, or combinations thereof.

The polysilicon strips 22a, 22b, 22c are formed on the dielectric layer 25. In one embodiment, a gate oxide layer (not shown) is formed over the fin structure 23 prior to the formation of the polysilicon strips 22a, 22b, 22c. Namely the gate oxide layer is first formed over the fin structure 23 and then the polysilicon strips 22a, 22b, 22c are formed over the gate oxide layer. In one embodiment, the polysilicon strips 22a, 22b, 22c are formed under a temperature from about 450 degrees Celsius to about 650 degrees Celsius, for example, from about 480 degrees Celsius to about 620 degrees Celsius. In one embodiment, the polysilicon strips 22a, 22b, 22c are formed under a pressure from about 0.2 torr to about 5.0 torr. In one embodiment, forming the polysilicon strips 22a, 22b, 22c includes growing a silicon layer in-situ doped with a group III or group V element, wherein an in-situ doping operation includes growing a silicon layer with dopant gas being concurrently introduced. In one embodiment, the dopant gas includes the group III or group V element. For example, in a CVD operation for in-situ forming the polysilicon strips 22a, 22b, 22c, the growing gases include silane ($SiH_4$), diborane ($B_2H_6$) and $H_2$, wherein the $SiH_4$ is used for growing the polysilicon strips 22a, 22b, 22c while $B_2H_6$ provides the dopant for the polysilicon strips 22a, 22b, 22c. In one embodiment, a concentration of the group III or group V element in the polysilicon strips 22a, 22b, 22c ranges from about 1E18 to about 5E22 atoms/$cm^3$. In one embodiment, a concentration of the group III or group V element in the polysilicon strips 22a, 22b, 22c ranges from about 1E19 to about 5E22 atoms/$cm^3$. In one embodiment, a concentration of the group III or group V element in the polysilicon strips 22a, 22b, 22c ranges from about 1E19 to about 1E22 atoms/$cm^3$. With the concentration of the group III or group V element in the polysilicon strips 22a, 22b, 22c being from about 1E19 to about 1E22 atoms/$cm^3$, the polysilicon strips 22a, 22b, 22c would be a layer relatively more conductive than a silicon layer without introducing dopants. In some embodiments, the polysilicon strips 22a, 22b, 22c may be formed by a deposition process, including chemical vapor deposition, physical vapor deposition, atomic layer deposition, high density plasma CVD, remote plasma CVD, plasma enhanced CVD, low-pressure CVD, atomic layer CVD, atmospheric pressure CVD, other suitable methods, or combinations thereof.

In one embodiment, forming the polysilicon strips 22a, 22b, 22c over the fin structure 23 includes forming the polysilicon strips 22a, 22b, 22c ex-situ doped with the group III or group V element, namely the polysilicon strips is formed prior to the doping of the group III or group V element. A source region 23a and a drain regions 23b are than formed either by high energy implant or epitaxy regrowth in the fin strtucture 23 laterally abutting the polysilicon strips 22a, 22b, 22c.

Figure 2B:
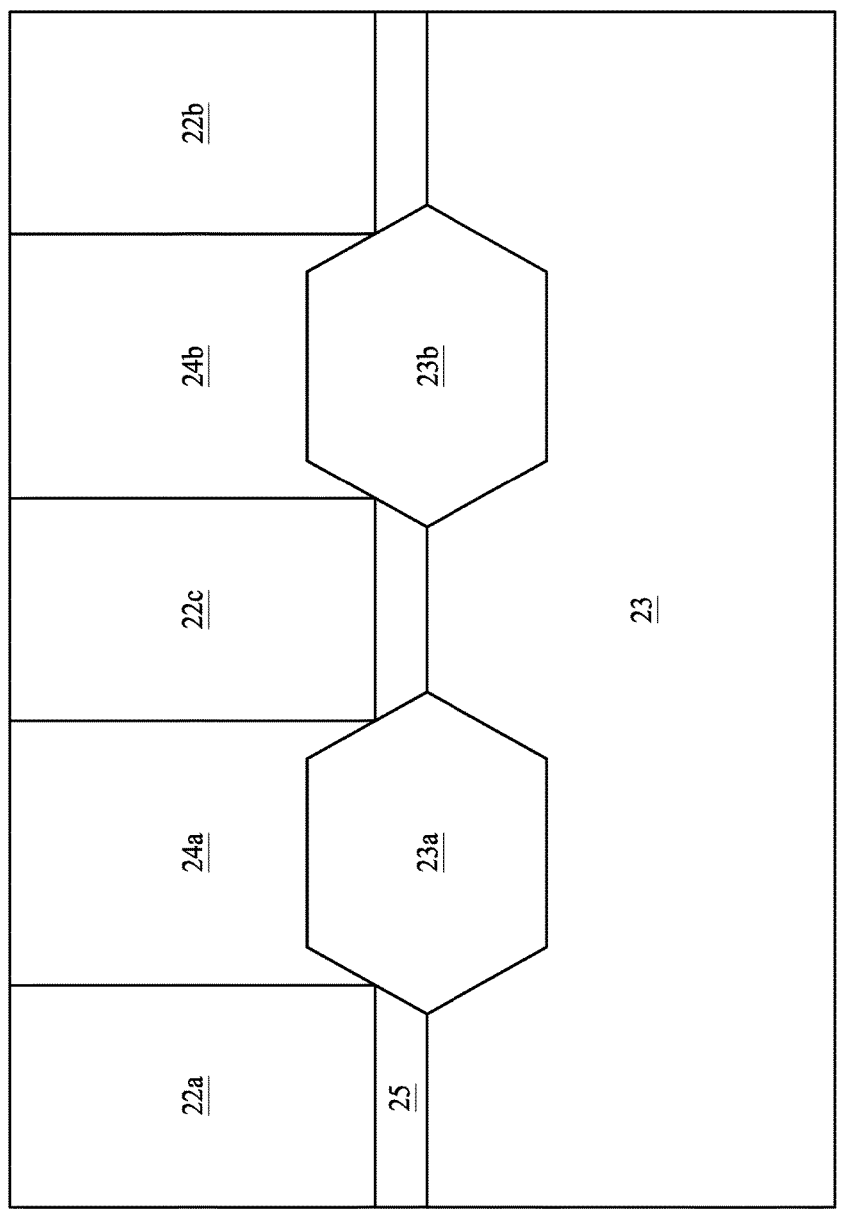

Referring to FIG. 2B, the ILD layer 24a is filled in a cavity between the polysilicon strips 22a and 22c, and the ILD layer 24b is filled in a cavity between the polysilicon strips 22c and 22b. The ILD layers 24a, 24b are used for electrical separation and features low dielectric constant k to minimize capacitive coupling. The ILD layers 24a, 24b may be formed by chemical vapor deposition, high density plasma CVD, spin-on deposition, physical vapor deposition (PVD or sputtering), or other suitable methods. The ILD layers 24a, 24b may include silicon oxide, silicon oxynitride, a low-k material, and/or other suitable dielectric. In some embodiments, the ILD layers 24a, 24b may be formed on and surrounding the polysilicon strips 22a, 22b, 22c and the fin structure 23.

Figure 2C:
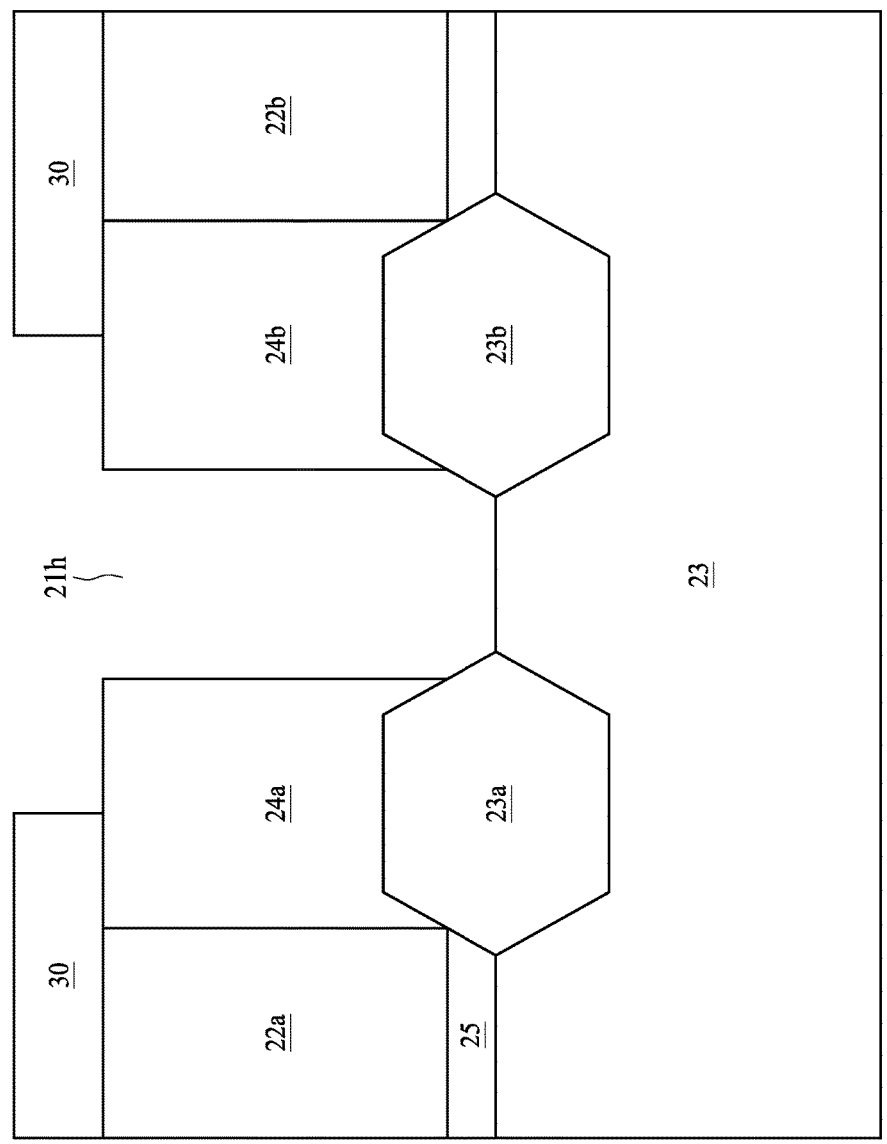

Referring to FIG. 2C, a photo mask 30 is placed on a surface formed by the polysilicon strips 22a, 22b, 22c and the ILD layers 24a, 24b. The photo mask is patterned to cover the polysilicon strips 22a, 22b and to expose the polysilicon strip 22c. The patterned photo mask 30 is used to define the area to be etched and to protect other regions. The photo mask 30 may include any suitable material, for example, silicon nitride, silicon oxynitride and silicon carbide.

The polysilicon strip 22c and the dielectric layer under the polysilicon strip 22c are then removed to form an opening 21h. In some embodiments, the polysilicon strip 22c and the dielectric layer under the polysilicon strip 22c can be removed by an etching process. The etching process may include a wet etching process, a dry etching process, or a combination thereof. In one example, a dry etching process used to etch the polysilicon strip 22c and the dielectric layer under the polysilicon strip 22c includes a chemistry including fluorine-containing gas. In furtherance of the example, the chemistry of the dry etch includes CF4, SF6, or NF3.

Figure 2D:
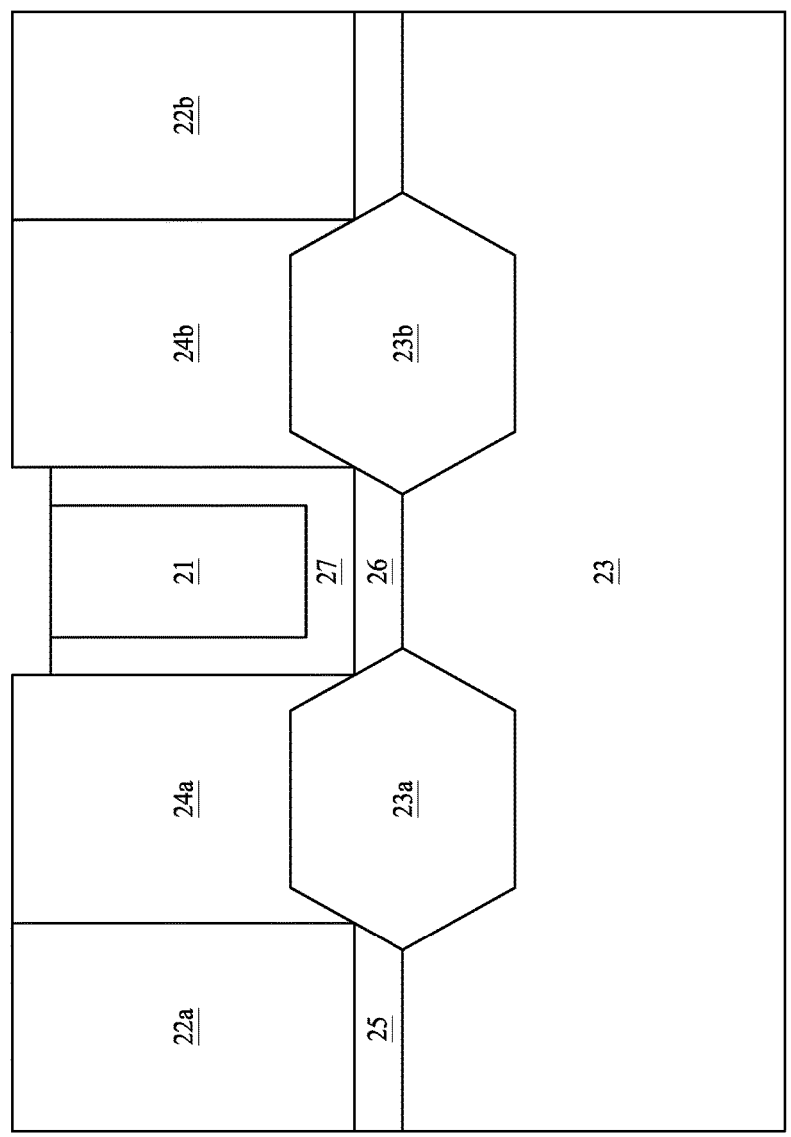

Referring to FIG. 2D, the dielectric layer 26 is formed on the fin structure 23. The dielectric layer 26 can be formed by any gate dielectric material. In one embodiment, the dielectric layer 26 includes a silicon dioxide, silicon oxynitride or a silicon nitride dielectric layer. The thickness of dielectric layer 26 may be between about 5 Å to about 30 Å. The dielectric layer 26 may be formed by a suitable process such as atomic layer deposition (ALD), chemical vapor deposition, Molecular-Beam Deposition (MBD), physical vapor deposition, thermal oxidation, UV-ozone oxidation, or combinations thereof. In some embodiments, the material of the dielectric layer 26 is different from that of the dielectric layer 25. Alternatively, the dielectric layer 25 and the dielectric layer 26 can be formed by same materials.

A HK layer 27 is then formed on the dielectric layer 26 and adjacent to the ILD layers 24a, 24b. The HK layer 27 may have a k value greater than about 7.0, and may include an oxide or a silicate of Hf, Al, Zr, La, Mg, Ba, Ti, Pb, and combinations thereof. Exemplary materials of the HK layer 27 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The HK layer 27 may be formed by a suitable process such as atomic layer deposition (ALD), chemical vapor deposition, Molecular-Beam Deposition (MBD), physical vapor deposition, thermal oxidation, UV-ozone oxidation, or combinations thereof.

A metal is deposited within the opening surrounding by the HK layer 27 to form an active gate structure 21. In some embodiments, the gate structure 21 may be formed by a deposition process, including chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure CVD (LPCVD), atomic layer CVD (ALCVD), atmospheric pressure CVD (APCVD), plating, other suitable methods, or combinations thereof. The gate structure 21 could be a metal gate electrode, such as, but not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. It should also be appreciated that the gate structure 21 needs not be a single material, but could include a composite stack of thin films. In one embodiment, depositing metal within the opening further includes using a CMP process to planarize the deposited metal.

Conventionally, during the operation in FIG. 2C, a photo mask is not used to protect the polysilicon strips 22a, 22b, so all of the polysilicon strips 22a, 22b, 22c would be removed. The metal then would be deposited to form the active gate structure and the dummy gate structures that are located at both edges of the fin structure 23. However, if the dummy gates are made of conductive materials, they cannot be used as high impedance elements. In addition, an undesired decoupling effect would occur between the dummy metal gates and the gate structure or the dummy metal gates of the semiconductor structure and the dummy metal gates of the adjacent semiconductor structure, which would degrade the performance of the semiconductor device.

In accordance with some embodiments of the present disclosure, during the operation in FIG. 2C, a photo mask 30 is used to protect the polysilicon strips 22a, 22b, and thus only the polysilicon strip 22c is replaced by the metal. Therefore, the polysilicon strips 22a, 22b can be used as high impedance elements, which would enhance the flexibility for designing the circuit by using the semiconductor structure 2 shown in FIG. 2D. In addition, by using such mixed gate structure, the decoupling effect between the polysilicon strips 22a, 22b and the gate structure 21 or the decoupling effect between the polysilicon strips 22a, 22b of the semiconductor structure 2 and the polysilicon strips of the adjacent semiconductor structure would be eliminated, which would in turn enhance the performance of the semiconductor structure 2.

In view of the above, some embodiments of the present disclosure provide a FinFET with mixed gate structure that would increase the flexibility for designing a circuit and eliminate the decoupling effect, so as to enhance the performance of the FinFET.

One embodiment of the present disclosure provides a semiconductor structure, comprising: a substrate, a fin structure, a metal gate and a first polysilicon strip. The fin structure is on the substrate. The metal gate is over the fin structure and is substantially perpendicular to the fin structure. The first polysilicon strip is at a first edge of the fin structure and is substantially parallel to the metal gate.

One embodiment of the present disclosure provides a semiconductor structure, comprising: a substrate, a fin structure, an active gate and two dummy gates. The fin structure is on the substrate. The active gate is over the fin structure and is substantially perpendicular to the fin structure. Two dummy gates are at both edges of the fin structure and are substantially parallel to the active gate. The active gate and the dummy gates are formed of different materials.

One embodiment of the present disclosure provides a method for forming a semiconductor structure. The method comprises: forming a fin structure along a first direction on a semiconductor substrate; depositing a first polysilicon strip along a second direction over the fin structure, the second direction being perpendicular to the first direction; depositing a second polysilicon strip along the second direction and at a first edge of the fin structure; depositing a third polysilicon strip along the second direction and at a second edge of the fin structure, the second edge being opposite to the first edge; removing the first polysilicon strip to form an opening; and filling the opening with the metal.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising:
    a substrate;
    a fin structure on the substrate;
    a metal gate at a middle of and over the fin structure and substantially perpendicular to the fin structure;
    a high-k dielectric layer surrounding a bottom and a sidewall of the metal gate;
    a first polysilicon strip at a first edge of the fin structure and substantially parallel to the metal gate;
    a first dielectric layer between the fin structure and the first polysilicon strip; and
    a metal gate dielectric layer having a bottom surface in contact with the fin structure and a top surface in contact with the high-k dielectric layer at the bottom of the metal gate, the metal gate dielectric layer being composed of silicon nitride,
    materials forming the first dielectric layer are different from that forming the metal gate dielectric layer.

2. The semiconductor structure of claim 1, further comprising a second polysilicon strip at a second edge of the fin structure and substantially parallel to the metal gate, the second edge being opposite to the first edge.

3. The semiconductor structure of claim 2, wherein both edges of the first polysilicon strip or the second polysilicon strip can be applied with a voltage.

4. The semiconductor structure of claim 1, wherein the metal gate comprises at least one of the following materials: copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

5. The semiconductor structure of claim 1, wherein the first polysilicon strip is configured as a high impedance element.

6. The semiconductor structure of claim 1, wherein an impedance of the first polysilicon strip is greater than an impedance of the metal gate.

7. The semiconductor structure of claim 1, wherein the first dielectric layer is composed of silicon oxides.

8. The semiconductor structure of claim 1, wherein the first dielectric layer comprises oxygen-containing materials.

9. A semiconductor structure, comprising:
    a substrate;
    a fin structure on the substrate;
    a metal gate at a middle of and over the fin structure and substantially perpendicular to the fin structure;
    a high-k dielectric layer surrounding a bottom and a sidewall of the metal gate;
    two dummy gates at both edges of the fin structure and substantially parallel to the metal gate;
    a first dielectric layer between the fin structure and the dummy gates, and
    a metal gate dielectric layer having a bottom surface in contact with the fin structure and a top surface in contact with the high-k dielectric layer at the bottom of the metal gate, the metal gate dielectric layer being composed of silicon nitride,
    materials forming the first dielectric layer are different from that forming the metal gate dielectric layer.

10. The semiconductor structure of claim 9, wherein the metal gate comprises at least one of the following materials: copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

11. The semiconductor structure of claim 9, wherein the dummy gates are formed of polysilicon.

12. The semiconductor structure of claim 9, wherein both edges of each dummy gate can be applied with a voltage.

13. The semiconductor structure of claim 9, wherein an impedance of one of the two dummy gates is greater than an impedance of the metal gate.

14. The semiconductor structure of claim 9, wherein the two dummy gates are configured as high impedance elements at both edges of the fin structure.

15. The semiconductor structure of claim 9, wherein the first dielectric layer is composed of silicon oxides.

16. A semiconductor structure, comprising:
a substrate;
a fin structure on the substrate;
a metal gate at a middle of and over the fin structure and substantially perpendicular to the fin structure;
a high-k dielectric layer surrounding a bottom and a sidewall of the metal gate;
a polysilicon gate at one edge of the fin structure and substantially parallel to the metal gate, a first dielectric layer in contact with the fin structure and a gate electrode of the polysilicon gate; and
a second dielectric layer having a bottom surface in contact with the fin structure and a top surface in contact with the high-k dielectric layer at the bottom of the metal gate,
wherein the second dielectric layer comprises silicon nitrides and the first dielectric layer comprises oxygen-containing material.

17. The semiconductor structure of claim 16, wherein the metal gate comprises at least one of the following materials: copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

18. The semiconductor structure of claim 16, wherein an impedance of the polysilicon gate is greater than an impedance of the metal gate.

19. The semiconductor structure of claim 16, wherein the polysilicon gate is configured as a high impedance element.

20. The semiconductor structure of claim 16, wherein the first dielectric layer comprises silicon oxides or silicon oxynitrides.

* * * * *